United States Patent
Ooishi et al.

(10) Patent No.: US 7,589,492 B2
(45) Date of Patent: Sep. 15, 2009

(54) VOLTAGE DETECTING APPARATUS FOR A HYBRID ELECTRIC VEHICLE

(75) Inventors: Manabu Ooishi, Shizuoka (JP); Katsuyuki Iwasaki, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 334 days.

(21) Appl. No.: 11/650,477

(22) Filed: Jan. 8, 2007

(65) Prior Publication Data
US 2007/0183195 A1 Aug. 9, 2007

(30) Foreign Application Priority Data
Feb. 9, 2006 (JP) ............................. 2006-032255

(51) Int. Cl.
*H01M 10/46* (2006.01)
(52) U.S. Cl. ...................... 320/104; 320/116
(58) Field of Classification Search ................ 320/104, 320/107, 110, 114, 116
See application file for complete search history.

(56) References Cited

U.S. PATENT DOCUMENTS 4,306,179 A * 12/1981 Whitford .................... 318/139
2003/0230443 A1 * 12/2003 Cramer et al. ............. 180/65.5

FOREIGN PATENT DOCUMENTS

JP 11-176480 7/1999

* cited by examiner

*Primary Examiner*—Edward Tso
(74) *Attorney, Agent, or Firm*—Kratz, Quintos & Hanson, LLP

(57) ABSTRACT

Providing a voltage detecting apparatus, which can detect rapidly a malfunction of a battery for a car structured by connecting a plurality of unit cells in series, a whole voltage value of both ends of a cell block corresponding a voltage detecting circuit assigned by a low-voltage CPU and a voltage value of both ends of the randomly selected unit cell are detected. When a difference of the whole voltage value and a product of multiplying the voltage value of the selected unit cell and a number of unit cells in the cell block are not less than a predetermined value, or when the whole voltage value or the product of multiplying the voltage value and the number of unit cells is out of a specification value range of the voltage value, it is judged that the battery malfunctions.

3 Claims, 3 Drawing Sheets ized the voltage detecting apparatus is characterized in that a plurality of unit cells connected in

VOLTAGE DETECTING APPARATUS FOR A HYBRID ELECTRIC VEHICLE

The priority application Number Japan Patent Application 2006-003320 upon which this patent application is based is hereby incorporated by reference.

BACKGROUND OF THE INVENTION

1. Field of the Invention

This invention relates to a voltage detecting apparatus, especially, the voltage detecting apparatus for detecting a voltage between both ends of a high-voltage battery for a car, which is structured by a plurality of unit cells connected in series to each other.

2. Description of the Related Art

A hybrid electric vehicle (HEV) driven to get her by an engine and an electric motor is becoming popular. The HEV includes two types of batteries, which are a low-voltage battery of about 12V for starting the engine and a high-voltage battery for driving the electric motor. The high-voltage battery supplies a high voltage by connecting in series unit batteries formed with secondary batteries, such as nickel-metal hydride batteries or lithium ion batteries, or unit cells formed with at least one secondary battery.

By repeating to charge and discharge the high-voltage battery, respective voltages of both ends of the unit cells change to have various values, that is each charged condition (State-Of-Charge: SOC) varies. For maintaining durability and the safety of each unit cell, charging the unit cell may be prohibited when the highest SOC (largest voltage value of the both ends) of the unit cells reaches a preset upper limit SOC (upper limit voltage value of the both ends), and discharging the unit cell may be prohibited when the lowest SOC (lowest voltage value of the both ends) of the unit cells reaches a preset lower limit SOC (lower limit voltage value of the both ends). In the HEV, by supplementing battery energy to a gasoline engine for hill-climbing, and by regenerating energy back to the battery when going downhill, that is by assisting/regenerating, the voltage value of the high-voltage battery is changed by driving conditions. Therefore, it is required that the voltage value of both ends of the high-voltage battery during the HEV driving is always monitored.

A voltage detecting apparatus for detecting a voltage value of both ends of each unit cell structuring the high-voltage battery is proposed in Patent Document 1. In the voltage detecting apparatus according to Patent Document 1, a main battery (high-voltage battery) is separated into a plurality of modules, and a circuit for detecting voltage value of both ends of each module and a circuit for detecting total voltage value of the whole main battery are separately provided. When the voltage value of both ends of each module and the total voltage value of the main battery are judged to be both abnormal values by judging respectively whether or not each voltage value is an abnormal value, malfunction of the battery is determined and charging/discharging of the main battery is stopped. Since the circuit for detecting voltage value of each module and the circuit for detecting total voltage value of the whole main battery are separately provided, when any one of the circuits malfunctions, the other circuit in a normal condition can detect the voltage value of the main battery to minimize the reduction of the performance thereof.

Accordingly the apparatus in Patent Document 1, by comparing the total voltage value detected by the circuit for detecting the total voltage value and a sum of each voltage value detected by the circuit for detecting a voltage value of each module, malfunction of the circuit for detecting total voltage value or the circuit for detecting voltage value of the module can be detected. Furthermore, by detecting each voltage value of each unit battery in the module, and comparing the voltage value of the module and a sum of each voltage value of each unit battery, malfunction of the circuit for detecting a voltage value of the module can be detected. Patent Document 1 is the Japan Published Patent Application No. H11-176480.

SUMMARY OF THE INVENTION

Objects to be Solved

According to the voltage detecting apparatus shown in Patent Document 1, the voltage value of both ends of the plurality of modules is detected, and it is judged whether or not each voltage value is abnormal. After that, the total voltage value of the main battery is detected, and it is judged whether or not the voltage value is abnormal. Since actions of prohibiting driving and charging/discharging the battery are done when both judgement are abnormal, final judgement of an abnormality requires a long time. Furthermore, when the voltage value of both ends of the module is normal, and any one of the unit cells in the module malfunctions, an abnormal condition cannot be detected.

One object of the present invention is to provide a voltage detecting apparatus which can detect rapidly abnormality of the high-voltage battery when the voltage value of the high-voltage battery structured by the unit cells connected in series is detected, and it is judged whether or not the voltage value is abnormal.

How to Attain the Object of the Present Invention

In order to overcome the above problems and attain the object of the present invention, a voltage detecting apparatus is characterised in that a plurality of unit cells connected in series so as to structure a high-voltage battery for a car, and segmented to at least one cell block including at least one unit cell; a voltage detecting device arranged corresponding to one cell block or more cell blocks for detecting a voltage value between both ends of the cell block and a voltage value between both ends of the unit cell; and a control device controlling to detect the voltage value between both ends of the cell block corresponding to the voltage detecting device and the voltage value between both ends of one unit cell selected randomly from the cell block, and judging whether or not the high-voltage battery of the car has a malfunction based on the detected voltage value between both ends of the cell block and the detected voltage value between both ends of one unit cell.

The voltage detecting apparatus is further characterised in that the voltage detecting apparatus mentioned above in the control device judges that the high-voltage battery for the car has a malfunction when a difference value by comparing a product, which is the voltage value between both ends of the one unit cell multiplied by a number of the unit cells in the cell block, and the voltage value of both ends of the cell block is not smaller than a predetermined value.

The voltage detecting apparatus is furthermore characterised in that the voltage detecting apparatus mentioned above in the control device judges that the high-voltage battery for the car has the malfunction when any one of the voltage values of both ends of the cell block and a product, which is the voltage value between both ends of the one unit cell multiplied by a number of the unit cells in the cell block, is out of a specification value range of the voltage value of the cell block.

EFFECT OF THE INVENTION

According to the invention, it is judged whether or not the unit cell of the cell block malfunctions based on a voltage value of both ends of the cell block and a voltage value of both ends of one unit cell selected randomly. Since malfunction of each cell block is judged, malfunction of the high-voltage battery for a car can be judged more rapidly than when malfunction is judged after detecting whole voltage values of both ends of all cell blocks.

According to the invention, it is judged whether or not the difference value by comparing the product, which is the voltage value between both ends of the one unit cell multiplied by a number of the unit cells in the cell block, and the voltage value of both ends of the cell block, is not smaller than a threshold value. When the difference value is not smaller than the threshold value, it is considered that the unit cell or the other unit cell in the cell block would malfunction, so that it can be judged whether or not any unit cell in the cell block malfunctions. Thus, since it can be judged whether or not the unit cell in the cell block malfunctions, judging the malfunction of the high-voltage battery can be done more rapidly than judging the malfunction after detecting the whole voltage values of both ends of all cell blocks.

According to the invention, when any one of the voltage values of both ends of cell block and the product, which is the voltage value between both ends of the one unit cell multiplied by the number of the unit cells in the cell block, is out of the specification value range of the whole voltage value of the cell block, the malfunction of the cell block can be judged. Especially, when the voltage value of both ends of the cell block and the product, which is the voltage value between both ends of the one unit cell multiplied by the number of the unit cells in the cell block, are out of the specification value range of the voltage value of the cell block, the malfunction of the one unit cell can be judged. Thus, since the malfunction of the high-voltage battery for the car can be judged by detecting the voltage values of both ends of not all cell blocks, the malfunction of the high-voltage battery for the car can be judged.

The above and other objects and features of this invention will become more apparent from the following description taken in conjunction with the accompanying drawings.

DESCRIPTION OF THE PREFERRED EMBODIMENT

Figure 1:
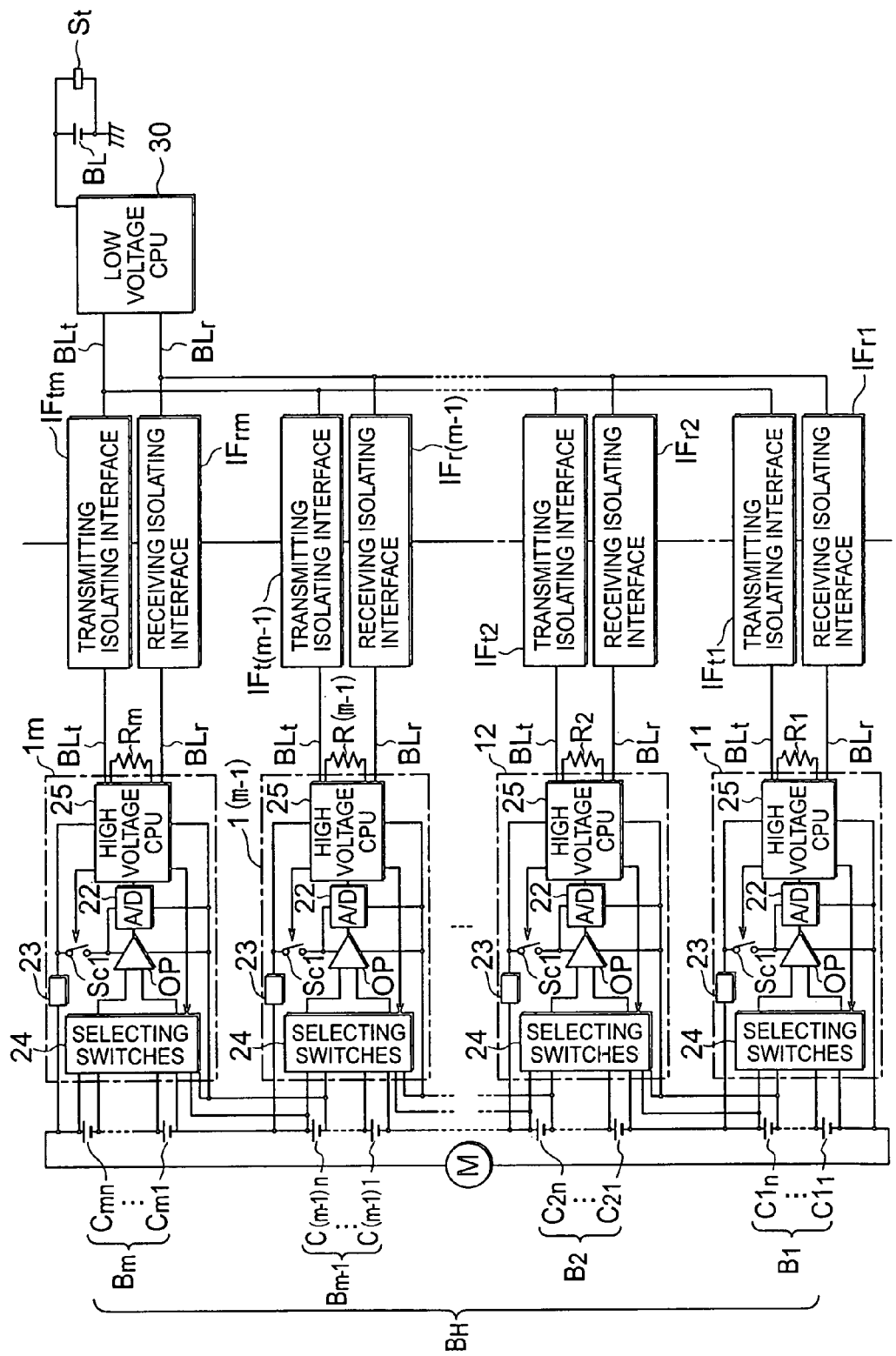
FIG. 1 is a circuit diagram of an embodiment of a voltage detecting apparatus according to the present invention.

A first embodiment of a voltage detecting apparatus according to the present invention will be described with reference to the Figures. FIG. 1 is a circuit diagram of the embodiment of the voltage detecting apparatus according to the present invention. A low-voltage battery is shown with a BL in FIG. 1. The low-voltage battery BL is formed with one unit cell as shown in FIG. 1. The low-voltage battery BL is used as an activating power source of a starter St for starting an engine. An alternator is connected to both ends of the low-voltage battery as a charger if required.

A high-voltage battery is shown with a BH in FIG. 1. The high-voltage battery BH is used as a power source of an electric motor M of an HEV using the electric motor M and an engine together as driving forces. The electric motor M is connected to both ends of the high-voltage battery BH as a load when required, and an alternator (not shown) is connected to both ends of the high-voltage battery as a charger if required.

The high-voltage battery BH is segmented to cell blocks from B1 to Bm of number m (m is any one of integers). Each cell blocks B1-Bm includes respectively unit cells from C11-C1n of number n (n is any one of integers) to Cm1-Cmn. The unit cells C11-Cmn are structured by at least one secondary battery. Unit cells supplying the same voltage value and same current value are connected in series. The unit cells between adjacent cell blocks at an end of each cell blocks C1n, C2n, C(m−1)n are common unit cells, voltage values of both ends of which can be detected respectively by each of two voltage detecting circuits 11-1m corresponding to respective cell blocks. In other words, the common unit cell C1n is connected to the voltage detecting circuits 11 and 12, the common unit cell C2n is connected to the voltage detecting circuits 12 and 13, and the common unit cell C(m−1)n is connected to the voltage detecting circuits 1(m−1) and 1m.

The voltage detecting apparatus includes the voltage detecting circuits 11-11m as voltage detecting devices, a low-voltage CPU 30, transmitting isolating interfaces Ift1-Iftm and receiving isolating interfaces Ifr1-Iform.

The voltage detecting circuits 11-1m are provided respectively corresponding to cell blocks B1-Bm. Each voltage detecting circuit 11-1m is activated by electric power supplied from unit cells C11-Cmn structuring one of cell blocks B1-Bm corresponding to the each voltage detecting circuit 11-1m. Thereby, a minus electrode of the corresponding cell block B1-Bm is one ground of the voltage detecting circuit 11-1m. Respective voltage detecting circuits 11-1m have ground levels different from each other. Therefore, dielectric strength of electric components structuring the voltage detecting circuits 11-1m can be reduced.

Each voltage detecting circuit 11-1m includes a differential amplifier OP for detecting a voltage value of both ends of the cell block corresponding thereto and a voltage value of both ends of any one of the unit cells C11-Cmn in the cell block, selecting switches for connecting the both ends of the each cell block B1-Bm and both ends of respective unit cells C11-Cmn structuring each cell block to the differential amplifier OP, an A/D converter 22 for converting the voltage value of both ends detected by the differential amplifier OP to a digital value and a high-voltage CPU 25 for controlling the selecting switches 24. The selecting switches 24 are formed with normal-close type switches provided at both ends of unit cells C11-Cmn. The whole voltage value of the both ends of the cell block herein is a voltage value between one end of one end unit cell in one cell block and the other end of the other end unit cell in the one cell block connected in series. For example, in the block B1, it is the voltage value between a minus electrode of C11 and a plus electrode of C1n.

The voltage detecting circuit 11-1m also includes a high-voltage power supply circuit 23 supplying a constant voltage from the supplied voltage of the corresponding cell block B1-Bm as an activating power source for the differential amplifier OP, the A/D converter 22 and the high-voltage CPU 25, and a break switch Sc1 provided between the high-voltage power supply circuit 23 and both of the differential amplifier OP and the A/D converter 22. The break switch Sc1 is controlled to turn ON/OFF by the high-voltage CPU 25.

The aforesaid voltage detecting circuit 11-1m is structured respectively in one semiconductor chip. Outer resistor R1-Rm is connected to the voltage detecting circuit 11-1m. The outer resistor R1-Rm corresponds to each address for the high-voltage CPU of the cell block B1-Bm to have different resistance value from each other. According to power-on the high-voltage power supply circuit 23, the high-voltage CPU reads-the resistance values and stores them as addresses for the high-voltage CPU in a memory (not shown).

A low-voltage CPU 30 having a memory (not shown) is activated by power supply from the low-voltage battery BL so as to control the voltage detecting circuits 11-1m according to a control program stored in the memory and an upper limit value and a lower limit value of the whole voltage value of both ends of the cell block.

A transmitting bus line BLt and a receiving bus line BLr are provided between the voltage detecting circuits 11-1m and the low-voltage CPU 30. The transmitting bus line BLt and a receiving bus line BLr are branched from the low-voltage CPU 30 toward a plurality of voltage detecting circuits 11-1m. The branched transmitting bus line BLt and the branched receiving bus line BLr have respectively transmitting isolating interfaces IFt1-IFtm and receiving isolating interfaces IFr1-IFrm. In other words, branch points of the transmitting bus line BLt and the receiving bus line BLr are located between the low-voltage CPU 30 and both of the transmitting isolating interfaces IFt1-Iftm and the receiving isolating interfaces IFr1-IFrm.

The isolating interfaces IFt1-IFtm and IFr1-IFrm connect the voltage detecting circuits 11-1m and the low-voltage CPU 30 isolatingly. The low-voltage CPU 30 and the voltage detecting circuits 11-1m can transmit and receive information in a condition of being isolated from each other. Thus, the high-voltage battery BH and the low-voltage battery BL can be isolated continuously. As the isolating interfaces IFt1-IFtm and IFr1-IFrm, a device through an optical medium, such as a photo-coupler with a light-emitting element and a light-receiving element and a device through a magnetic medium, such as a magnetic coupler are well known.

Figure 2:
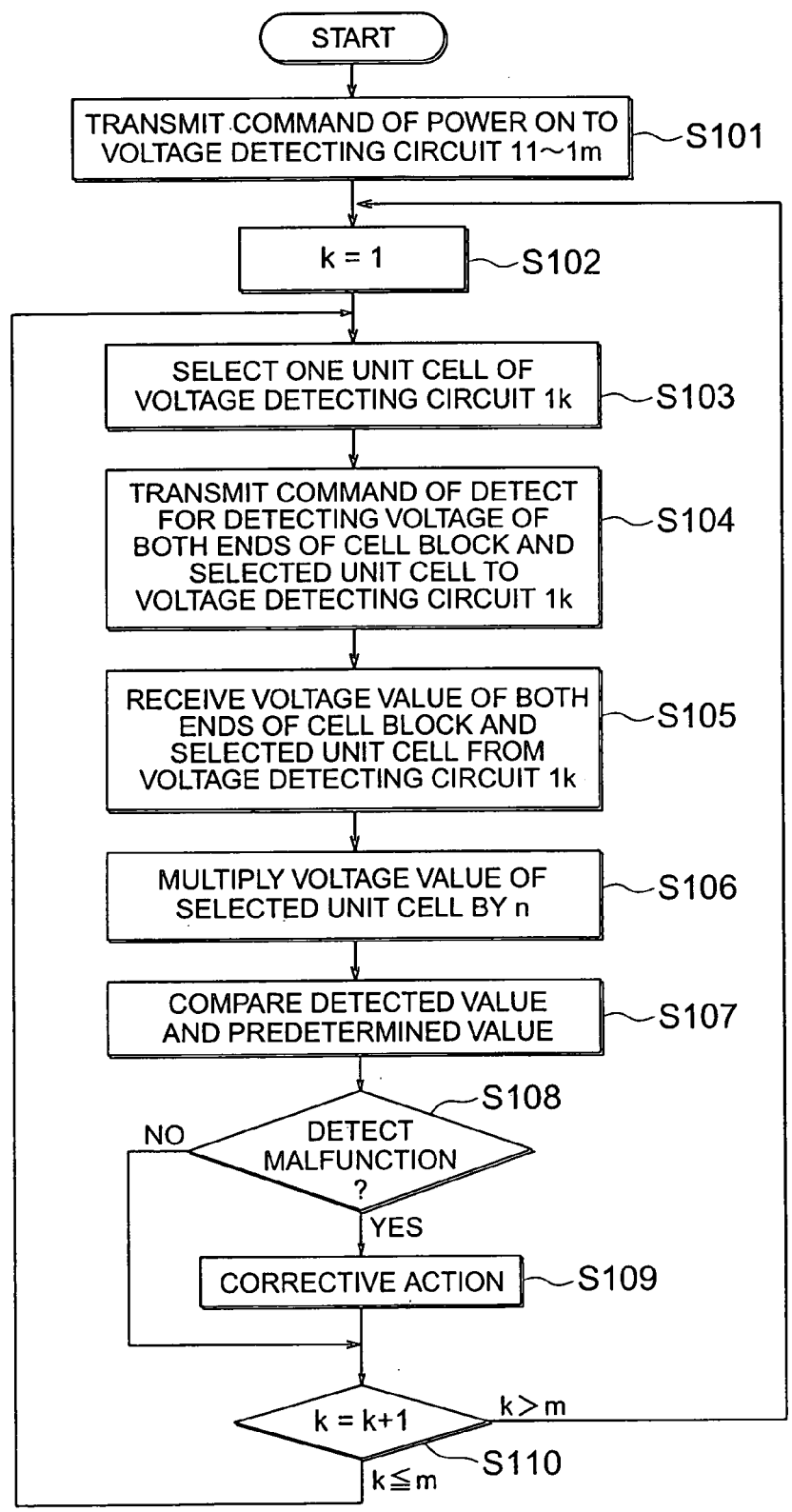
FIG. 2 is a flow chart of processes for detecting a malfunction from a voltage value of a cell block and a voltage value of a randomly selected unit cell in a low-voltage CPU of the voltage detecting apparatus shown in FIG. 1.
Figure 3:
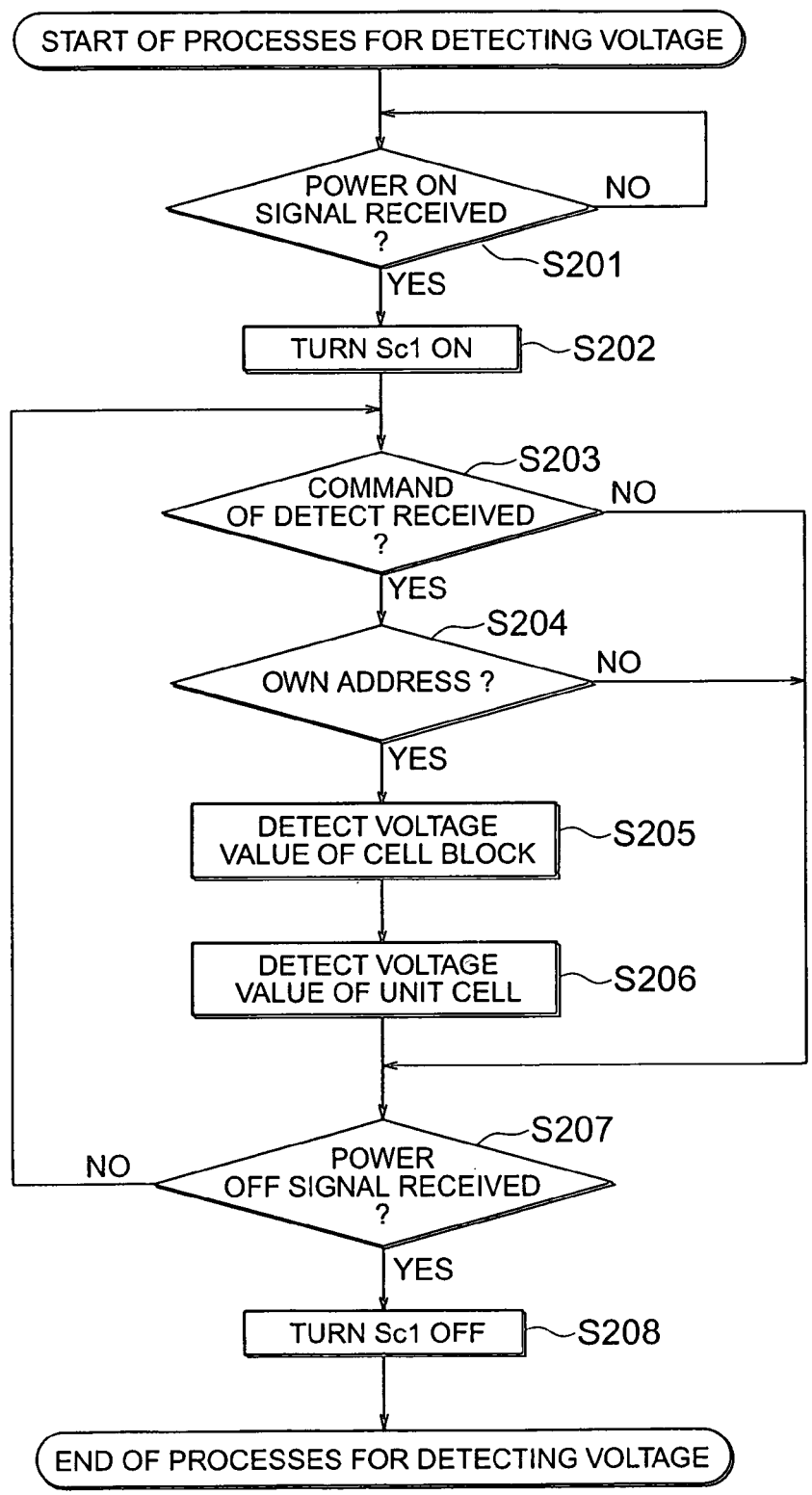
FIG. 3 is a flow chart of processes for detecting the voltage value of the cell block and the voltage value of the unit cell in a high-voltage CPU of the voltage detecting apparatus shown in FIG. 1.

Processes of detecting the whole voltage value of both ends of each cell block B1-Bm and the voltage value of both ends of the randomly selected unit cell in the voltage detecting apparatus as structured above, and judging whether or not the cell block malfunctions based on the voltage values of both ends are shown in FIGS. 2, 3. Flow charts shown in FIGS. 2, 3 are executed in the low-voltage CPU 30 and the high-voltage CPU 25 during the time an HEV ignition switch is ON. By executing the flow chart shown in FIG. 2 in the low-voltage CPU 30, the whole voltage value of each cell block and the voltage value of both ends of the randomly selected unit cells in the cell block are detected by the voltage detecting circuit 11-1m, and it is judged whether or not there is a malfunction. By executing the flow chart shown in FIG. 3 in the high-voltage CPU 25, the voltage values of both ends of the cell block and the randomly selected unit cell in the cell block are detected.

The process, shown in FIG. 2, of detecting the voltage value of each cell block and the voltage value of a randomly selected unit cell in the cell block by the voltage detecting circuit 11-1m, and judging whether or not there is a malfunction will be explained here. In a step S101, a command of power ON is sent to the voltage detecting circuit 11-1m and the process proceeds to step S102.

In the step S102, a variable k indicating a number of the voltage detecting circuit and the cell block is set to 1, and the process proceeds to step S103.

In the step S103, one unit cell is randomly selected from among the unit cells in the cell block corresponding to the voltage detecting circuit 1k, and the process proceeds to step S104. The one unit cell can be selected randomly by random numbers, or selected in order from an end of unit cells connected in series.

In the step S104, a command of detect for detecting the voltage value of both ends of the cell block corresponding to the voltage detecting circuit 1k and the voltage value of both ends of the one unit cell selected in the step S103 is transmitted to the voltage detecting circuit 1k, and the process proceeds to step S105.

In the step S105, the whole voltage value of both ends of the cell block and the voltage value of both ends of the selected one unit cell transmitted from the voltage detecting circuit 1k according to the command of detect transmitted in the step S104 are received and stored in the memory of the low-voltage CPU 30, and the process proceeds to step S106.

In the step S106, the voltage value of both ends of the selected unit cell received in the step S105 is multiplied by "n". In other words, the product by multiplying the voltage value of both ends of the selected unit cell and the number of the unit cells in the cell block is calculated. For example, when ten unit cells are connected in series in the cell block, the voltage value is multiplied by ten.

In step S107, the detected voltage value of both ends of the cell block and a value of the voltage value of the both ends of the selected unit cell multiplied by "n" are compared with a specification value range, and a difference of the voltage value of both ends of the cell block and the value of the voltage value of both ends of the selected unit cell multiplied by "n" are compared with a predetermined value, and the process proceeds to step S108. When the value of the voltage value of both ends of the selected unit cell multiplied by "n" is out of the specification value range, it can be judged that the selected unit cell is malfunctioning. When the value of the voltage value of both ends of the selected unit cell multiplied by "n" is in the specification value range, but the detected voltage value of both ends of the cell block is out of the specification value range, it can be judged that a unit cell in the cell block other than the selected unit cell is malfunctioning. When the detected voltage value of both ends of the cell block and the value of the voltage value of both ends of the selected unit cell multiplied by "n" are in the specification value range, but the difference of the detected voltage value of both ends of the cell block and the value of the voltage value of both ends of the selected unit cell multiplied by "n" is out of the predetermined value, it can be judged that the unit cell, the voltage value of both ends of which is out of a specification value range, in the cell block other than the selected unit cell exists and the unit cell in the cell block other than the selected unit cell is malfunctioning. The predetermined value herein is a value, by which malfunction of one unit cell can be detected, in other words, the voltage value of both ends of one unit cell to be out of the specification value range can be detected.

In step S108, when malfunction of the cell block and/or the unit cell is detected (YES in S108) by comparing the values in the step S107, the process proceeds to step S109. When malfunction of the cell block and/or the unit cell is not detected (NO in S108), the process proceeds to step S110.

In the step S109, information of malfunction in the high-voltage battery BH is transmitted to an upper unit (not shown), and the process proceeds to a step S111. The upper unit indicates a warning signal to a driver of an HEV based on the transmitted information and/or prohibits charging/discharging the high-voltage battery.

In the step S110, when a number resulting from adding one to the variable k showing a number of the voltage detecting circuit and the cell block is not larger than m, the process returns to the step S103. When the number resulting from adding one to the variable k is larger than m, the process returns to the step S102.

By repeating the flow chart, it can be judged step-by-step whether or not there is a malfunction on each cell block.

Processes in the high-voltage CPU 25 of the voltage detecting circuit 11-1m for detecting the voltage value of both ends of the cell block and the voltage value of both ends of the selected unit cell according to the command of detect transmitted from the low-voltage CPU 30 to the voltage detecting circuit in the step S104 of the flow chart in FIG. 2 are explained with reference to a flow chart in FIG. 3.

In step S201, it is judged whether or not a signal of power ON transmitted from the low-voltage CPU 30 through the transmitting bus line BLt and the transmitting isolating interface IFt1-IFtm to each voltage detecting circuit 11-1m is received. When the signal is received (YES in S201), the process proceeds to step S202. When the signal is not received (NO in S201), judging is repeated until the signal is received.

In step S202, the break switches Sc1 of the voltage detecting circuits 11-1m are turned ON. Thereby, electric power from each corresponding cell block B1-Bm to the differential amplifier OP and the A/D converter 22 structuring the each voltage detecting circuit 11-1m are supplied.

In step S203, it is judged whether or not the command of detect transmitted from the low-voltage CPU 30 through the transmitting bus line BLt and the transmitting isolating interface IFt1-IFtm to each voltage detecting circuit 11-1m is received. When the command is received (YES in S203), the process proceeds to step S204. When the command is not received (NO in S203), the process proceeds to step S207.

In step S204, it is judged whether or not an address assigned by the received command is its own address. When the address is its own address, the process proceeds to step S205. When the address is not its own address, the process proceeds to step S207.

In step S205, the voltage value of both ends of the cell block is detected and the process proceeds to step S206. The high-voltage CPU 25 connects both ends of the cell block to the differential amplifier OP. Thereby, a digital value of the voltage value of both ends of the cell block is outputted from the A/D converter 22 to the high-voltage CPU 25. Correspondingly, the high-voltage CPU 25 transmits the digital value of the voltage value of both ends of the cell block, which assigns its own address, to the receiving isolating interface IFr1-IFrm. The digital value of the voltage value of both ends of the cell block transmitted to the receiving isolating interface IFr1-IFrm is transmitted through the receiving bus line BLr to the low-voltage CPU 30.

In step S206, the voltage value of both ends of the selected unit cell assigned by the received command of detect is detected, and the process proceeds to step S207. The high-voltage CPU connects both ends of the selected unit cell to the differential amplifier OP. Thereby, a digital value of the voltage value of the assigned cell block is outputted from the A/D converter 22 to the high-voltage CPU 25. Correspondingly, the high-voltage CPU 25 transmits the digital value of the voltage value of both ends of the assigned unit cell, which assigns its own address, to the receiving isolating interface IFr1-IFrm. The digital value of the voltage value of both ends of the assigned unit cell transmitted to the receiving isolating interface IFr1-IFrm is transmitted through the receiving bus line BLr to the low-voltage CPU 30.

In step S207, it is judged whether or not a signal of power OFF transmitted from the low-voltage CPU 30 through the transmitting bus line BLt and the transmitting isolating interface IFt1-IFtm to each voltage detecting circuit 11-1m is received. When the signal is received (YES in S207), the process proceeds to step S208. When the signal is not received (NO in S207), the process returns to step S203.

In step S208, the break switch Sc1 of each voltage detecting circuit 11-1m is turned OFF. Thereby, electric power from the each corresponding cell block B1-Bm to the differential amplifier OP and the A/D converter 22 structuring each voltage detecting circuit 11-1m are broken.

According to the aforesaid voltage detecting apparatus, it is judged whether or not the cell block B1 malfunctions based on the voltage value of both ends of the cell block B1 and the voltage value of both ends of the one unit cell 11 randomly selected from among the unit cells C11-C1n in the cell block B1. Since malfunction of each cell block is judged, malfunction of the high-voltage battery BH can be judged more rapidly than that malfunction is judged after detecting voltage values of both ends of all cell blocks B1-Bm.

It is judged whether or not the difference of the voltage value of both ends of the cell block B1 and the product of multiplying the voltage value of both ends of the unit cell C11 randomly selected from the cell block B1 and number n of unit cells in the cell block B1 (the value of the voltage value of both ends of the unit cell C11 multiplied by n) is not less than the predetermined value. When the difference is not less than the predetermined value, even if the unit cell C11 acts normally, it is considered that the other unit cell C12-C1n in the cell block B1 may malfunction, so that it can be judged whether or not the unit cell in the cell block B1 malfunctions. Thereby, malfunction of the high-voltage battery BH can be judged more rapidly than that malfunction is judged after detecting voltage values of both ends of all cell blocks B1-Bm.

When the voltage value of both ends of the cell block B1 or the product of multiplying the voltage value of both ends of the unit cell C11 and number n of unit cells in the cell block B1 is out of a specification value range of the voltage value of the cell block, that is over an upper limit or lower than a lower limit of the voltage value, it can be judged that the cell block is malfunctioning. Thereby, the malfunction of the high-voltage battery BH can be judged without detecting all voltage values of both ends of the cell blocks B1-Bm. Then, malfunction of the high-voltage battery BH can be judged rapidly. Additionally, when the product of multiplying the voltage value of both ends of the unit cell C11 and number n of unit cells in the cell block B1 is out of the specification value range of the voltage value of the cell block, it can be judged that the unit cell C11 is malfunctioning.

According to the embodiment, the command of detect for detecting the voltage values of both ends of one cell block and one unit cell from the low-voltage CPU 30 to one voltage detecting circuit is transmitted, and it is judged whether or not the one cell block is malfunctioning, and thereafter the command of detect for detecting the voltage values of both ends of the other cell block and the other unit cell to the other voltage detecting circuit is transmitted, and it is judged whether or not the other cell block is malfunctioning. Alternatively, the commands of detect for detecting the voltage values of both ends of the cell block and the unit cell to respective voltage detecting circuits are transmitted at once, and it can be respectively judged in order of receiving the detected value from each voltage detecting circuit whether or not the respective cell blocks is malfunctioning.

According to the above embodiment, when the malfunction is detected in step S108, processing for the malfunction is acted on in the next step S109. Alternatively, when a malfunction is detected, after detecting the voltage value of both ends of the other unit cell in the same cell block, and comparing the voltage value of the cell block and it, the is malfunctioning is judged.

According to the above embodiment, the high-voltage battery BH is segmented into a plurality of cell blocks. When the number of unit cells in the high-voltage battery is small, the whole high-voltage battery can be handled as one cell block without segmenting the plurality of cell blocks.

While, in the above embodiment, the present invention is described, it is not limited thereto, and various change and modifications can be made within the scope of the present invention.

What is claimed is:

1. A voltage detecting apparatus comprising:
    a plurality of unit cells connected in series so as to structure a high-voltage battery for a car, and segmented to at least one cell block including at least one unit cell;
    a voltage detecting device arranged corresponding to the at least one or more cell blocks for detecting a voltage value between both ends of the at least one or more cell blocks and a voltage value between both ends of one of the at least one unit cell; and
    a control device controlling to detect the voltage value between both ends of the at least one or more cell blocks corresponding to the voltage detecting device and the voltage value between both ends of one of the at least one unit cell selected randomly from the at least one or more cell blocks, and judging whether or not the high-voltage battery of the car has a malfunction based on the detected voltage value between both ends of the at least one or more cell blocks and the detected voltage value between both ends of the selected one unit cell,
    wherein the control device judges that the high-voltage battery for the car has the malfunction when a difference value by comparing a product, which is the voltage value between both ends of the selected one unit cell multiplied by a number of the unit cells in the at least one or more cell blocks, and the voltage value of both ends of the at least one or more cell blocks is not smaller than a predetermined value.

2. The voltage detecting apparatus according to claim 1, wherein the control device judges that the high-voltage battery for the car has the malfunction when either one of the voltage value of both ends of the at least one or more cell blocks and a product, which is the voltage value between both ends of the selected one unit cell multiplied by a number of the unit cells in the at least one or more cell blocks, is out of a specification value range of the voltage value of both ends of the at least one or more cell blocks.

3. A voltage detecting apparatus comprising:
    a plurality of unit cells connected in series so as to structure a high-voltage battery for a car, and segmented to at least one cell block including at least one unit cell;
    a voltage detecting device arranged corresponding to the at least one or more cell blocks for detecting a voltage value between both ends of the at least one or more cell blocks and a voltage value between both ends of one of the at least one unit cell; and
    a control device controlling to detect the voltage value between both ends of the at least one or more cell blocks corresponding to the voltage detecting device and the voltage value between both ends of one of the at least one unit cell selected randomly from the at least one or more cell blocks, and judging whether or not the high-voltage battery of the car has a malfunction based on the detected voltage value between both ends of the at least one or more cell blocks and the detected voltage value between both ends of the selected one unit cell,
    wherein the control device judges that the high-voltage battery for the car has the malfunction when either one of the voltage value of both ends of the at least one or more cell blocks and a product, which is the voltage value between both ends of the one selected unit cell multiplied by a number of the unit cells in the at least one or more cell blocks, is out of a specification value range of the voltage value of both ends of the at least one or more cell blocks.

* * * * *